(12) United States Patent
Misaki

(10) Patent No.: US 12,310,152 B2
(45) Date of Patent: May 20, 2025

(54) LIGHT EMITTING ELEMENT INCLUDING SUBSTRATE, EMISSION PARTS, INSULATION LAYER, AND ELECTRODES

(71) Applicant: NICHIA CORPORATION, Anan (JP)

(72) Inventor: Takao Misaki, Anan (JP)

(73) Assignee: NICHIA CORPORATION, Anan (JP)

( * ) Notice: Subject to any disclaimer, the term of this patent is extended or adjusted under 35 U.S.C. 154(b) by 460 days.

(21) Appl. No.: 17/744,328

(22) Filed: May 13, 2022

(65) Prior Publication Data

US 2022/0376140 A1 Nov. 24, 2022

(30) Foreign Application Priority Data

May 20, 2021 (JP) .................................. 2021-084989
Dec. 8, 2021 (JP) .................................. 2021-199636

(51) Int. Cl.
*H10H 20/831* (2025.01)
*H10H 20/813* (2025.01)
*H10H 20/857* (2025.01)

(52) U.S. Cl.
CPC ...... *H10H 20/8312* (2025.01); *H10H 20/813* (2025.01); *H10H 20/857* (2025.01)

(58) Field of Classification Search
CPC ....... H01L 33/382; H01L 33/08; H01L 33/46; H01L 33/62; H01L 33/24; H10H 20/8312; H10H 20/813; H10H 20/857
See application file for complete search history.

(56) References Cited

U.S. PATENT DOCUMENTS

| 2018/0166498 A1 | 6/2018 | Sung et al. |
| 2019/0259909 A1 | 8/2019 | Sunda et al. |
| 2019/0267527 A1* | 8/2019 | Emura ................. H01L 27/156 |
| 2020/0044116 A1 | 2/2020 | Chen et al. |
| 2020/0052175 A1 | 2/2020 | Oh et al. |
| 2020/0295229 A1 | 9/2020 | Kim et al. |

FOREIGN PATENT DOCUMENTS

| JP | 2013-258174 A | 12/2013 |
| JP | 2014-022608 A | 2/2014 |
| JP | 2019-145618 A | 8/2019 |
| JP | 2019-149474 A | 9/2019 |
| KR | 20140071594 A | 6/2014 |

\* cited by examiner

*Primary Examiner* — Changhyun Yi
(74) *Attorney, Agent, or Firm* — Foley & Lardner LLP

(57) ABSTRACT

A light emitting element includes: a substrate; a first emission part and a second emission part disposed on the substrate, each comprising a first semiconductor layer of a first conductivity type, a second semiconductor layer of a second conductivity type, and an active layer positioned between the first semiconductor layer and the second semiconductor layer; an insulation layer covering the first emission part and the second emission part and including: a plurality of first openings that includes multiple first openings located above the first semiconductor layer of the first emission part and multiple first openings located above the first semiconductor layer of the second emission part, and a plurality of second openings that include at least one second opening located above the second semiconductor layer of the first emission part and at least one second opening located above the second semiconductor layer of the second emission part.

18 Claims, 14 Drawing Sheets

LIGHT EMITTING ELEMENT INCLUDING SUBSTRATE, EMISSION PARTS, INSULATION LAYER, AND ELECTRODES

CROSS-REFERENCE TO RELATED APPLICATIONS

This application is based upon and claims the benefit of priority from Japanese Patent Application No. 2021-199636, filed on Dec. 8, 2021, and Japanese Patent Application No. 2021-084989, filed on May 20, 2021, the entire contents of both of which are incorporated herein by reference.

BACKGROUND

The present disclosure relates to a light emitting element.

Japanese Patent Publication No. 2014-022608 discloses a light emitting element in which an insulation film is disposed on and covers a p-side semiconductor layer and an n-side semiconductor layer, the insulation film having an opening in which an n-side electrode is disposed for electrical connection with the n-side semiconductor.

For such a light emitting element, there is a need to improve the light emission distribution while securing the area for the active layer in an emission part.

A light emitting element according to an embodiment of the present invention includes: a substrate having a quadrangular top plan view shape; a first emission part and a second emission part disposed on the substrate, the first emission part and the second emission part each including a first conductivity type first semiconductor layer, a second conductivity type second semiconductor layer, and an active layer positioned between the first semiconductor layer and the second semiconductor layer; an insulation layer covering the first emission part and the second emission part and including in each of the first emission part and the second emission part, a plurality of first openings positioned above the first semiconductor layer and at least one second opening positioned above the second semiconductor layer, the plurality of first openings being positioned outward of the periphery of the second semiconductor layer in a top plan view; a first electrode disposed on the insulation layer and electrically connected to the first semiconductor layer of the first emission part at the first openings provided in the first emission part; a second electrode electrically connected to the second semiconductor layer of the second emission part at the second opening provided in the second emission part; and a third electrode disposed on the insulation layer, electrically connected to the second semiconductor layer of the first emission part at the second opening provided in the first emission part, and electrically connected to the first semiconductor layer of the second emission part at the first openings provided in the second emission part, wherein the substrate has an exposed part exposed from the first emission part and the second emission part, the exposed part overlapping a straight line that passes the center of the substrate in a top plan view.

A light emitting element according to certain embodiments of the present invention can improve the light emission distribution while securing the area for the active layer in an emission part.

DETAILED DESCRIPTION

Figure 1:
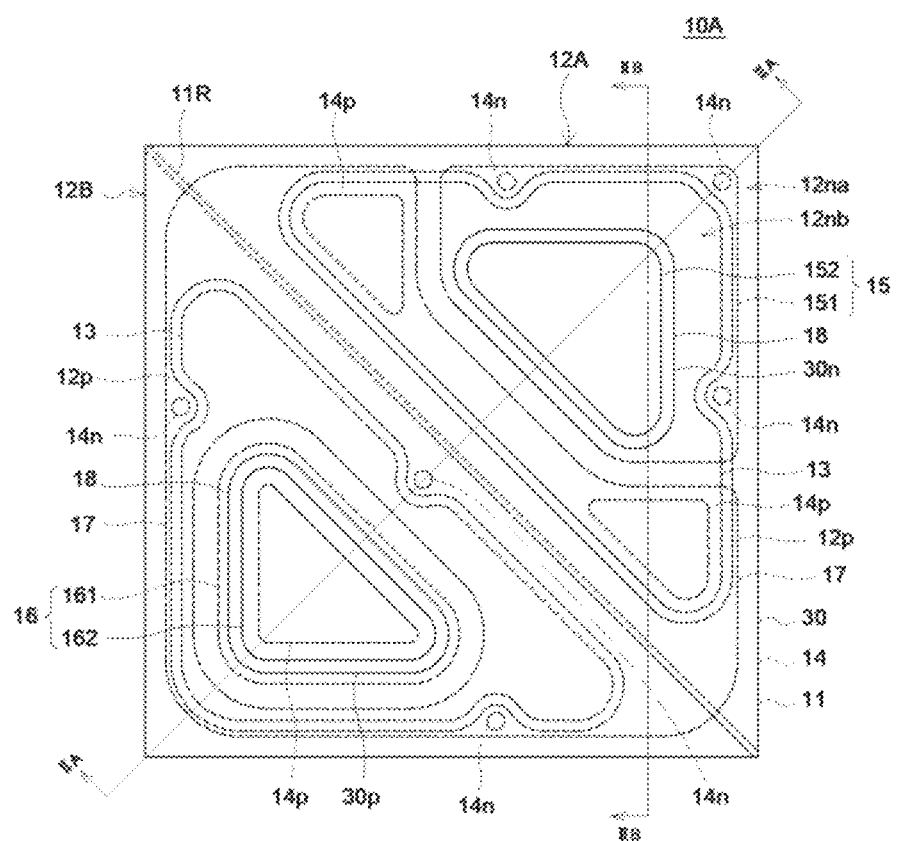
FIG. 1 is a schematic top plan view of a light emitting element according to a First Embodiment.

Light emitting elements and light emitting devices according to certain embodiments of the present invention will be explained below.

The drawings referenced in the explanation below are schematic illustrations of the present invention. As such, the scale, spacing, positional relationship of the members might be exaggerated, or a portion of a member omitted. Moreover, the scale or spacing of the members may not be consistent between a top plan view and a cross-sectional view. In the description below, the same designations and reference numerals basically denote the same or similar members for which a detailed explanation will be omitted as appropriate.

First Embodiment

Figure 2A:
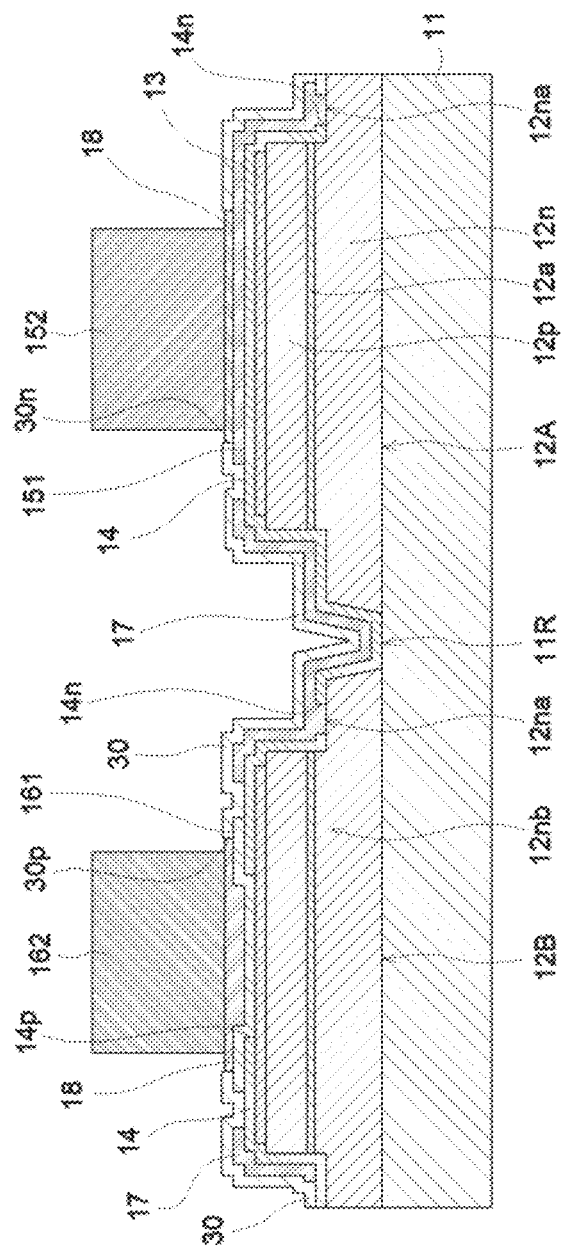
FIG. 2A is a schematic cross-sectional view taken along line IIA-IIA in FIG. 1.
Figure 2B:
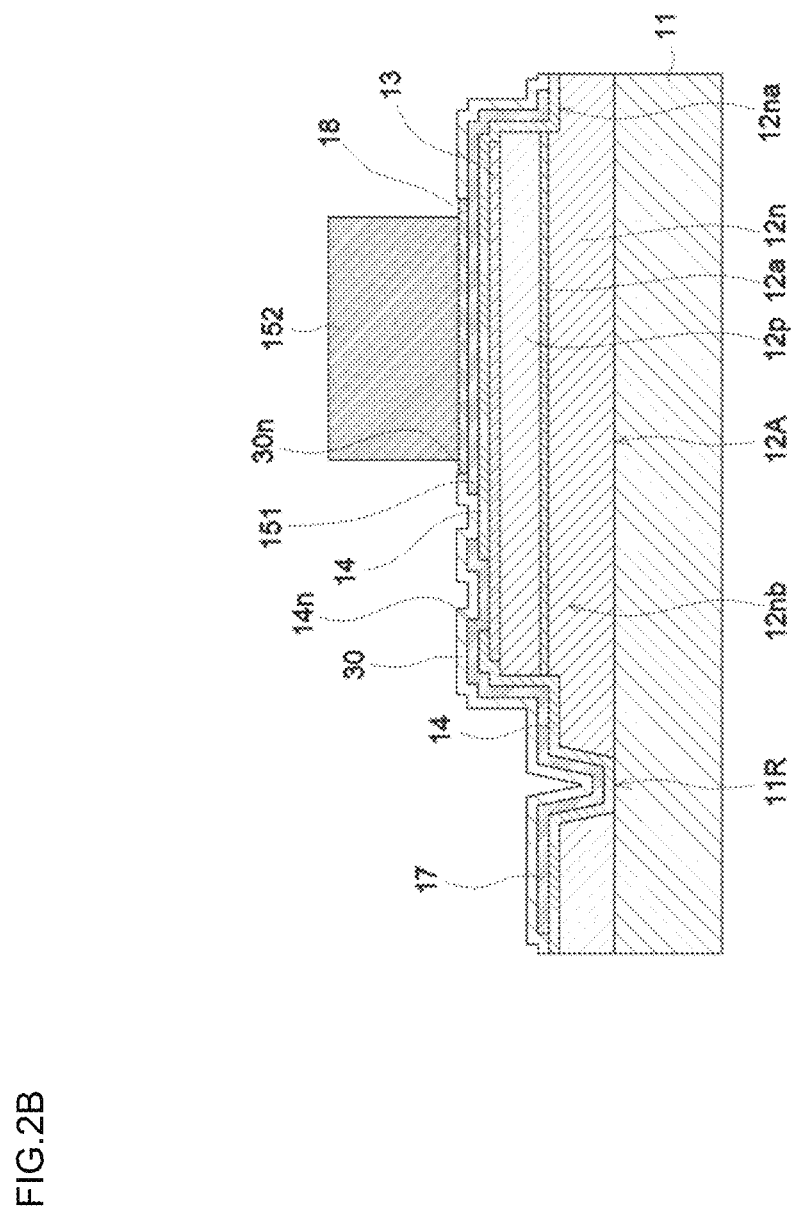
FIG. 2B is a schematic cross-sectional view taken along line IIB-IIB in FIG. 1.

The structure of a light emitting element 10A according to a First Embodiment will be explained with reference to FIG. 1 and FIG. 2A to FIG. 2C. FIG. 1 is a schematic top plan view explaining the details of the structure of the light emitting element 10A. The cross section shown in FIG. 2A is a schematic representation of the cross section taken along line IIA-IIA in the top plan view in FIG. 1. The cross section shown in FIG. 2B is a schematic representation of the cross section taken along line IIB-IIB in the top plan view in FIG.

Figure 2C:
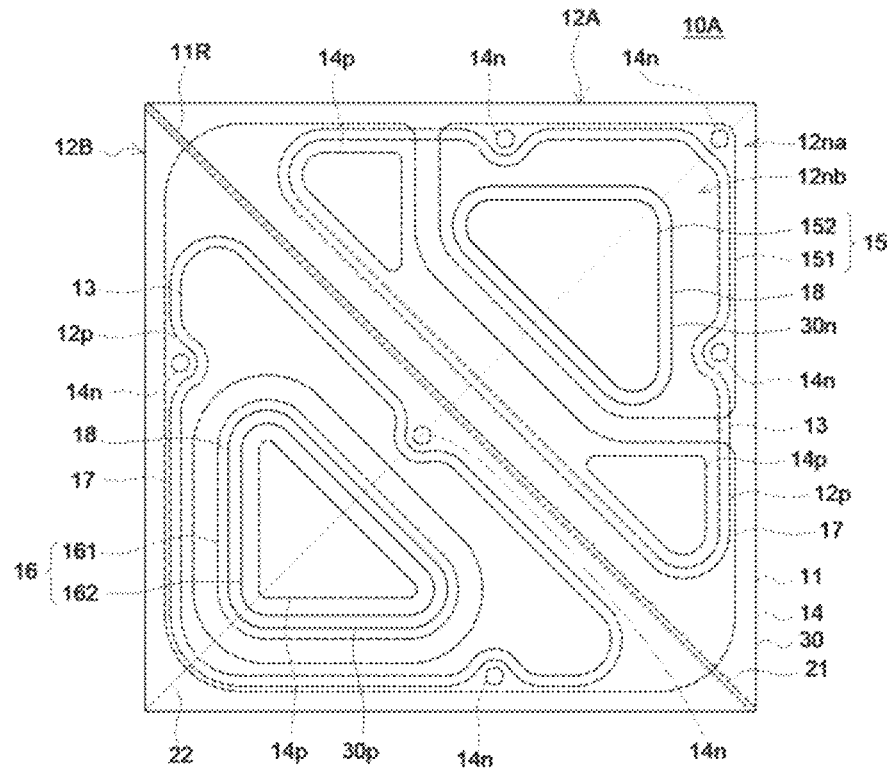
FIG. 2C is a schematic top plan view of a light emitting element according to the First Embodiment.

1. FIG. 2C is a schematic top plan view explaining the details of the structure of the light emitting element 10A.

The light emitting element 10A includes a substrate 11, a first emission part 12A and a second emission part 12B disposed on the substrate 11. The first emission part 12A and the second emission part 12B each include a first conductivity type first semiconductor layer 12n, a second conductivity type second semiconductor layer 12p, and an active layer 12a positioned between the first semiconductor layer 12n and the second semiconductor layer 12p. The light emitting element 10A includes an insulation layer 14 covering the first emission part 12A and the second emission part 12B, a first electrode 15 electrically connected to the first semiconductor layer 12n of the first emission part 12A, a second electrode 16 electrically connected to the second semiconductor layer 12p of the second emission part 12B, and a third electrode 17 electrically connected to the second semiconductor layer 12p of the first emission part 12A and electrically connected to the first semiconductor layer 12n of the second emission part 12B. The first electrode 15 may include a first wiring part 151 and a first external connection part 152 disposed on the first wiring part 151. The second electrode 16 may include a second wiring part 161 and a second external connection part 162 disposed on the second wiring part 161. Applying a voltage between the first external connection part 152 and the second external connection part 162 supplies an electric current to the first emission part 12A and the second emission part 12B via the first electrode 15, the second electrode 16, and the third electrode 17, allowing the active layers 12a of the first emission part 12A and the second emission part 12B to emit light. The light emitted by the active layers 12a of the first emission part 12A and the second emission part 12B is extracted primarily from the lower face and the lateral faces of the substrate 11.

The substrate 11 can be made of any substrate material that allows a semiconductor to be epitaxially grown. For the substrate 11, for example, an insulation substrate is used. In this embodiment, a sapphire substrate having light transmissivity is preferably used from the perspective of improving the light extraction efficiency of the light emitting element 10A. The top plan view shape of the substrate 11 is quadrangular, for example. In this embodiment, the top plan view shape of the substrate 11 is a square. The length of each side of the substrate 11 is, for example, 100 μm to 1500 μm, preferably 100 μm to 500 μm.

The substrate 11 has an exposed part 11R exposed from the first emission part 12A and the second emission part 12B. In a top plan view, the exposed part 11R is provided to overlap a straight line that passes the center of the substrate 11. In this embodiment, the exposed part 11R is provided to overlap a first diagonal line 21 of the substrate 11 in a top plan view. The exposed part 11R is positioned between the first emission part 12A and the second emission part 12B in a top plan view. The exposed part 11R is continuously provided from one corner to another corner of the substrate 11. Of the two diagonal lines of the substrate 11 in a top plan view, the one different from the first diagonal line 21 is designated as the second diagonal line 22. The center of the substrate 11 is the intersection between the first diagonal line 21 and the second diagonal line 22. The width of the exposed part 11R can be set, for example, in a range of 3 μm to 10 μm.

The first emission part 12A and the second emission part 12B are stacked structures made by stacking semiconductor layers on the substrate 11. The first emission part 12A and the second emission part 12B disposed on the substrate 11 are electrically isolated. The first emission part 12A and the second emission part 12B each include a first conductivity type first semiconductor layer 12n, a second conductivity type second semiconductor layer 12p, and an active layer 12a positioned between the first semiconductor layer 12n and the second semiconductor layer 12p. In this embodiment, the first conductivity type is n type, and the second conductivity type is p type. For the first semiconductor layer 12n, the active layer 12a, and the second semiconductor layer 12p, a semiconductor such as $In_XAl_YGa_{1-X-Y}N$ ($0 \leq X$, $0 \leq Y$, $X+Y<1$) or the like can be suitably used. Each of these semiconductor layers may be of a single layer structure, a stacked structure having multiple layers of different compositions and thicknesses, or a superlattice structure. Particularly, the active layer 12a is preferably of a single quantum well or multiple quantum well structure in which thin layers are stacked to generate a quantum effect. The semiconductor layers can be doped with an n-type impurity, such as Si, Ge, or the like, and/or a p-type impurity, such as Mg, Zn, or the like. The first semiconductor layer 12n includes, for example, a semiconductor layer doped with an n-type impurity. The second semiconductor layer 12p includes, for example, a semiconductor layer doped with a p-type impurity.

As shown in FIG. 1, in a top plan view, the first semiconductor layers 12n of the first emission part 12A and the second emission part 12B each have a substantially triangular shape, for example. In a top plan view, the first emission part 12A and the second emission part 12B are separated by the straight line shaped exposed part 11R, and the area of the first emission part 12A and the area of the second emission part 12B are substantially equal. In the case of serially connecting the first emission part 12A and the second emission part 12B, this can reduce variations of the voltage applied to the first emission part 12A and the second emission part 12B, thereby reducing the light emission variations in the first emission part 12A and the second emission part 12B.

The first semiconductor layer 12n in each of the first emission part 12A and the second emission part 12B has a first portion 12na and a second portion 12nb that is positioned inward of the first portion 12na in a top plan view. The first portion 12na in which no active layer 12a or second semiconductor layer 12p are disposed is the portion where the first semiconductor layer 12n is exposed from the active layer 12a and the second semiconductor layer 12p. In second portion 12nb, the active layer 12a and the second semiconductor layer 12p are disposed. In a top plan view, the first portion 12na is located outward of the periphery of the second semiconductor layer 12p. In a top plan view, the first portion 12na has a plurality of extended portions extending towards the second portion 12nb, and the first openings 14n of the insulation layer 14 described later are positioned in the extended portions of the first portion 12na.

A light reflecting electrode 13, as shown in FIG. 1 and FIGS. 2A to 2C, is disposed on the upper face of each of the second semiconductor layers 12p, and is electrically connected to the second semiconductor layer 12p. The light reflecting electrode 13 is disposed to cover substantially the entire upper face of the second semiconductor layer 12p.

The light reflecting electrode 13 can diffuse the electric current supplied via the second electrode 16 and the third electrode 17 to the second semiconductor layer 12p. The light reflecting electrode 13 preferably has high reflectivity with respect to the light from the active layer 12a. The light reflecting electrode 13 preferably has a reflectance with respect to the light from the active layer 12a of at least 70%, for example, preferably at least 80%. For the light reflecting electrode 13, a metal material having good conductivity and reflectivity can be used. For the metal material used for the light reflecting electrode 13, for example, Ag, Al, Ni, Ti, Pt, Ta, Ru, or an alloy having any of these metals as a main component can be suitably used. For the light reflecting electrode 13, furthermore, these metal materials can be used as a single layer or a stack of layers. The thickness of the light reflecting electrode 13 can be set, for example, in a range of 300 nm to 1 µm.

As shown in FIG. 1 and FIGS. 2A to 2C, the insulation layer 14 is disposed to cover the surfaces of the first emission part 12A and the second emission part 12B, and the surface of the exposed part 11R of the substrate 11. The insulation layer 14 includes a plurality of first openings 14n positioned above the first semiconductor layer 12n and at least one second opening 14p positioned above the second semiconductor layer 12p in each of the first emission part 12A and the second emission part 12B. In a top plan view, the first openings 14n are positioned above the first portion 12n located outward of the periphery of the second semiconductor layer 12p. In a top plan view, the first openings 14n are provided as islands. In this embodiment, three first openings 14n are provided in each of the first emission part 12A and the second emission part 12B. Furthermore, two second openings 14p in the first emission part 12A and one second opening 14p in the second emission part 12B are provided.

In a top plan view, at least one of the first openings 14n located in the second emission part 12B is positioned between the first external connection part 152 and the second external connection part 162. This can facilitate the supply of electric current to the region between the first external connection part 152 and the second external connection part 162 thereby improving the light emission distribution of the light emitting element 10A. At least one of the first openings 14n located in the second emission part 12B is preferably positioned on the second diagonal line 22. This can further improve the light emission distribution of the light emitting element 10A.

At least one of the first openings 14n provided in the first emission part 12A is positioned on the second diagonal line 22. In this embodiment, one of the first openings 14n located in the first emission part 12A is positioned on the second diagonal line 22 between the first external connection part 152 and the outer edge of the substrate 11. This can facilitate the supply of electric current between the first external connection part 152 and the outer edge of the substrate 11 thereby improving the light emission distribution of the light emitting element 10A. The first wiring part 151 is electrically connected to the first semiconductor layer 12n at the first opening 14n located on the second diagonal line 22 between the first external connection part 152 and the outer edge of the substrate 11. Accordingly, the distance between the outer edge of the first wiring part 151 and the outer edge of the substrate 11 on the second diagonal line 22 is shorter than the distance between the outer edge of the third electrode 17 and the outer edge of the substrate 11 on the second diagonal line 22.

The size of a first opening 14n can be suitably set based on the sizes of the first emission part 12A and the second emission part 12B. In the case in which a first opening 14n has a circular shape in a top plan view, for example, the diameter of the first opening 14n can be set, for example, in a range of 5 µm to 20 µm. Setting the diameter of a first opening 14n as at least 5 µm can increase the areas used to connect the first electrode 15 and the third electrode 17 to the respective first semiconductor layers 12n to thereby deter the forward voltage Vf from increasing. Setting the diameter of a first opening 14n as 20 µm at most can reduce the areas from which the active layers 12a are removed thereby preventing the areas of the active layer 12a from becoming small.

The second openings 14p provided in the first emission part 12A are located in the area other than the region between the first external connection part 152 and the second external connection part 162. The area of the second semiconductor layer 12p of the first emission part 12A between the first external connection part 152 and the second external connection part 162 tends to be a small, making it difficult give desirable shapes to the second openings 14p. Locating the second openings 14p in the first emission part 12A in an area other than the region between the first external connection part 152 and the second external connection part 162 allows the second openings 14p to have desirable shapes, thereby stabilizing the electrical properties of the light emitting element 10A.

In a top plan view, the area of a second opening 14p provided in the first emission part 12A is larger than the area of a first opening 14n. For example, the area of a second opening 14p provided in the first emission part 12A can be set in a range of 30 times to 50 times the area of a first opening 14n provided in the first emission part 12A.

For the insulation layer 14, an oxide or nitride can be used. For the insulation layer 14, for example, an oxide or nitride containing at least one material selected from the group consisting of Si, Ti, Zr, Nb, Ta, and Al can be suitably used. For the insulation layer 14, for example, $SiO_2$, SiN, or the like is used. For the insulation layer 14, a single layer or a stack of layers of these oxides and nitrides can be used. The insulation layer 14 may be a DBR (distributed Bragg reflector) in which two or more dielectric layers of different refractive indices are stacked.

As shown in FIG. 1 and FIGS. 2A to 2C, the first electrode 15 is disposed on the insulation layer 14 and electrically connected to the first semiconductor layer 12n of the first emission part 12A at the first openings 14n provided in the first emission part 12A. A portion of the first electrode 15 is located above the second semiconductor layer 12p via the insulation layer 14. The second electrode 16 is electrically connected to the second semiconductor layer 12p of the second emission part 12B at the second opening 14p provided in the second emission part 12B. A portion of the second electrode 16 is located on the insulation layer 14. The third electrode 17 is disposed on the insulation layer 14, electrically connected to the second semiconductor layer 12p of the first emission part 12A at the second openings 14p in the first emission part 12A, and electrically connected to the first semiconductor layer of the second emission part 12B at the first openings 14n in the second emission part 12B. The third electrode 17 continuously covers the first emission part 12A, the second emission part 12B, and the exposed part 11R. The first emission part 12A and the second emission part 12B are serially connected by the first electrode 15, the second electrode 16, and the third electrode 17.

In this embodiment, the first electrode 15 and the third electrode 17 are electrically connected to the respective first semiconductor layers 12n only at the first openings 14n provided in the first portions 12na of the first semiconductor layers 12n. In other words, the first electrode 15 and the third electrode 17 are not electrically connected to the respective first semiconductor layers 12n located inward of the peripheries of the second semiconductor layers 12p. This allows large areas to be secured for the active layers 12a in the first emission part 12A and the second emission Part 12B.

Allowing the first electrode 15 and the third electrode 17 to be electrically connected to the respective first semiconductor layers 12n located inward of the peripheries of the second semiconductor layers 12p would necessitate partial removal of the active layers 12a, which reduces the areas of the active layers 12a in the light emitting element 10A. The first electrode 15 and the third electrode 17 may be electrically connected to third portions of the respective first semiconductor layers 12n exposed from and positioned inward of the peripheries of the second semiconductor layers 12p to the extent that they do not adversely affect the light emission distribution. In a top plan view, the third portions are the portions surrounded by the second semiconductor layers 12p.

The first electrode 15 includes a first wiring part 151 disposed on the first semiconductor layer 12n in the first emission part 12A and a first external part 152 disposed on and electrically connected to the first wiring part 151. The first wiring part 151 is electrically connected to the first semiconductor layer 12n at the first openings 14n provided in the first emission part 12A. The second electrode 16 includes a second wiring part 161 disposed on the second semiconductor layer 12p in the second emission part 12B and a second external connection part 162 disposed on and electrically connected to the first wiring part 161. The second wiring part 161 is electrically connected to the light reflecting electrode 13 at the second opening 14p provided in the second emission part 12B. The first wiring part 151, the second wiring part 161, and the third electrode 17 are disposed so as not to overlap in a top plan view. In a top plan view, the second wiring part 161 is surrounded by the third electrode 17. The distance between the outer edge of the third electrode 17 and the outer edge of the substrate 11 on the first diagonal line 21 at each end is substantially the same as the distance between the outer edge of the third electrode 17 and the outer edge of the substrate 11 on the second diagonal line 22 in the second emission part B.

For the first wiring part 151, the second wiring part 161, and the third electrode 17, a metal material can be used. For example, a metal such as Ag, Al, Ni, Rh, Au, Cu, Ti, Pt, Pd, Mo, Cr, or W by itself, or an alloy having any of these metals as a main component can be suitably used. In the case of using an alloy for the first wiring part 151, the second wiring part 161, and the third electrode 17, for example, an AlSiCu alloy or the like can be used. For the first wiring part 151, the second wiring part 161, and the third electrode 17, a single layer or multiple layers of these metal materials can be used. In this embodiment, the first wiring part 151, the second wiring part 161, and the third electrode 17 have a multilayer structure employing the same metal materials.

As shown in FIG. 2C, the first external connection part 152 and the second external connection part 162 are provided on the second diagonal line 22. The first external connection part 152 and the second external connection part 162 are disposed so as not to be aligned in the direction in parallel with the first diagonal line 21. Arranging the first external connection part 152 and the second external connection part 162 in this manner can increase the distance between the first external connection part 152 and the second external connection part 162, for example, as compared to the case of arranging the first external connection part 152 and the second external connection part 162 to oppose one another in the direction in parallel with a side of the substrate 11. This, as a result, can prevent the first external connection part 152 and the second external connection part 162 from straddling two wirings of different conductivity types when bonded to a substrate provided with wirings. In the case of using a conductive material such as solder in bonding the first external connection part 152 and the second external connection part 162 to the wirings, furthermore, this can reduce the chance of allowing the first external connection part 152 and the second external connection part 162 to be electrically connected by the conductive material. In other words, this can prevent the conductive material from short-circuiting the first external connection part 152 and the second external connection part 162. In a top plan view, the shortest distance between the first external connection part 152 and the second external connection part 162 is preferably set, for example, in a range of 30% to 60% of a length of a side of the substrate 11, more preferably 40% to 50%. The shortest distance between the first external connection part 152 and the second external connection part 162 is, for example, 120 µm to 250 µm.

The top plan view shapes of the first external connection part 152 and the second external connection part 162 are substantially triangular. In this embodiment, the top plan view shapes of the first external connection part 152 and the second external connection part 162 are rounded corner triangles. From the standpoint of improving the bonding quality and positioning accuracy between the wirings and the first external connection part 152 and the second external connection part 162, the first external connection part 152 and the second external connection part 162 preferably have substantially the same size.

In a top plan view, the first external connection part 152 and the second external connection part 162 each include a straight line part parallel to the first diagonal line 21. The distance between the straight line part of the first external connection part 152 and the straight line part of the second external connection part 162 corresponds to the shortest distance between the first external connection part 152 and the second external connection part 162. The lengths of the straight line parts of the first external connection part 152 and the second external connection part 162 can be set, for example, in a range of 20% to 40% of a length of a side of the substrate 11. The first external connection part 152 and the second external connection part 162 having such straight line parts can provide a region in which the distance between first external connection part 152 and the second external connection part 162 is constant. This does not allow the first external connection part 152 to become close to the second external connection part 162 at any portion, thereby preventing the first external connection part 152 from becoming electrically connected to the second external connection part 162 when being bonded to the substrate.

For the material for the first external connection part 152 and the second external connection part 162, metals such as Cu, Au, or Ni can be suitably used. For the first external connection part 152 and the second external connection part 162, a single layer or multiple layers of these metal materials can be utilized. The thicknesses of the first external connection part 152 and the second external connection part 162 can be set, for example, in a range of 30 µm to 70 µm.

As shown in FIG. 1 and FIGS. 2A to 2C, a protective film 30 is disposed to cover the surfaces of the insulation layer 14, the first electrode 15, the second electrode 16, and the third electrode 17. The protective film 30 covers the surfaces of the first emission part 12A and the second emission part 12B. The protective film 30 is a member for protecting the insulation layer 14, the first electrode 15, the second electrode 16, and the third electrode 17. The protective film 30 includes a third opening 30n positioned above the first wiring part 151 and a fourth opening 30p positioned above the second wiring part 161. In each of the third opening 30n and the fourth opening 30p, a seed electrode 18 is disposed. The seed electrode 18 is disposed between the first wiring part 151 and the first external connection part 152, and between the second wiring part 161 and the second external connection part 162. In the case of forming the first external connection part 152 and the second external connection part by plating, for example, the first external connection part 152 and the second external connection part 162 are grown from the seed electrodes 18.

As described above, the light emitting element 10A has the first electrode 15 and the third electrode 17 that are electrically connected to the respective first semiconductor layers 12n at the first openings 14n located in the first portions 12na. This can improve the light emission distribution of the light emitting element 10A while securing relatively large areas of the active layers in the first emission part 12A and the second emission part 12B. Furthermore, the light emitting element 10A has the first emission part 12A and the second emission part 12B that are isolated by the exposed part 11R provided to overlap the first diagonal line 21 that passes the center of the substrate 11. This can improve the light emission distribution by reducing variations of the voltage applied to the serially connected first emission part 12A and the second emission part 12B.

With respect to this embodiment, a light emitting element 10A having two emission parts has been described, but a light emitting element may be provided with three or more emission parts. With respect to this embodiment, a configuration that includes a protective film 30 has been described, but the protective film 30 does not have to be included. With respect to this embodiment, a configuration that includes a light reflecting electrode 13 has been described, but the light reflecting electrode 13 does not have to be included. With respect to this embodiment, a configuration that includes a seed electrode 18 has been described, but the first external connection part 152 and the second external connection part 162 can be directly disposed on the first wiring part 151 and the second wiring part 161, respectively, without disposing any seed electrode 18. With respect to this embodiment, a configuration that includes a straight line shaped exposed part 11R in the substrate 11 has been described, but the first emission part 12A and the second emission part 12B can be electrically isolated by providing a high resistance semiconductor layer in place of the exposed part 11R. Furthermore, a configuration in which the exposed part 11R having a straight line shape in a top plan view has been described, but the exposed part 11R may be curved in part. A configuration in which the exposed part 11R has the shape of a single straight line has been described, but the exposed part 11R may be made up of multiple straight line portions. For example, the exposed part 11R may be made up of a first straight line portion positioned between the first external connection part 152 and the second external connection part 162 and overlapping the first diagonal line 21, and a second straight line portion formed continuously from the first straight line portion and parallel to a side of the substrate 11.

Second Embodiment

The structure of a light emitting element 10B according to a Second Embodiment will be explained next with reference to FIG. 3A.

Figure 3A:
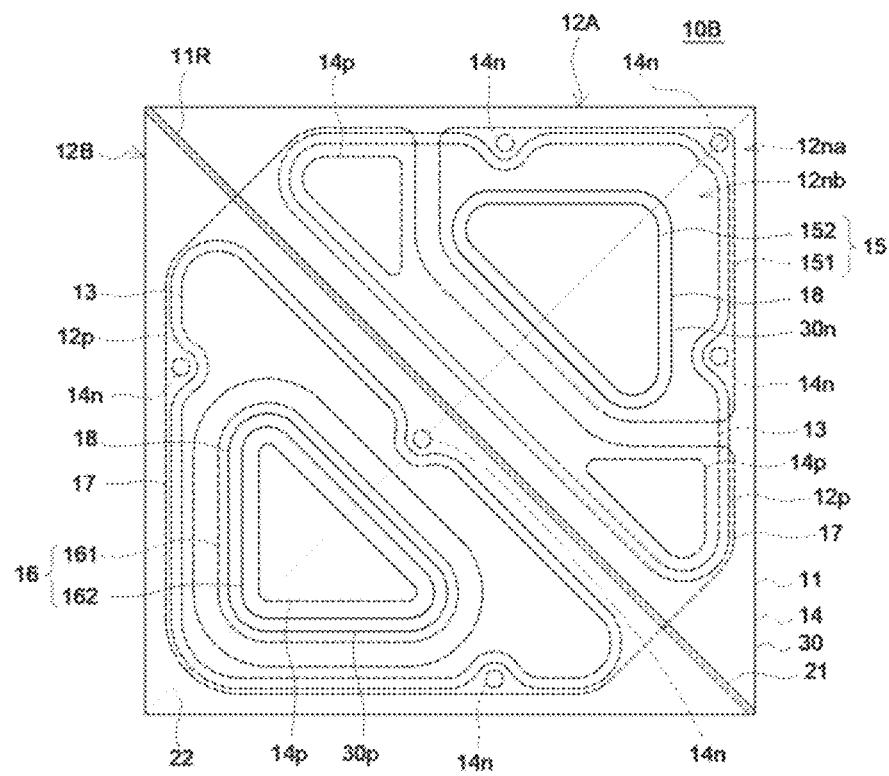
FIG. 3A is a schematic top plan view of a light emitting element according to a Second Embodiment.

The light emitting element 10B, as shown in FIG. 3A, primarily differs from the light emitting element 10A in terms of the layout of the third electrode 17. The same constituents as those in FIG. 1 are denoted with the same reference numerals for which an explanation will be omitted.

As shown in FIG. 3A, in this embodiment, the first distance between the outer edge of the third electrode 17 and the outer edge of the substrate 11 on the first diagonal line 21 at each end is larger than the second distance between the outer edge of the third electrode 17 and the outer edge of the substrate 11 on the second diagonal line 22 in the second emission part 12B. In other words, the distance from the outer edge of the substrate 11 near the exposed part 11R to the outer edge of the third electrode 17 at each corner is larger than the distance from the outer edge of the substrate 11 not near the exposed part 11R to the outer edge of the third electrode 17 in the second emission part 12B. Here, as in the case of the light emitting device 100B described layer in which a light transmitting member 60 is disposed in the periphery of the light emitting element 10A, for example, a portion of the light transmitting member 60 might creep up onto the exposed part 11R. This can occur because neither the first emission part 12A nor the second emission part 12B is present in the exposed part 11R, making the region of light emitting element 10A where the exposed part 11R is located lower than the other regions. If the light transmitting member 60 containing a phosphor were to come into contact with the third electrode 17, the third electrode 17 might be corroded to reduce the reliability of the light emitting device. According to this embodiment in which the first distance is set to be relatively large, the light transmitting member 60 is deterred from reaching and corroding the third electrode 17 even if it creeps up onto the exposed part 11R. As a result, the reliability of the light emitting device can be increased.

The first distance can be set, for example, in a range of 1.5 to 3 times the second distance. Setting the first distance as at least 1.5 times the second distance can make it easier to deter the light transmitting member 60 from reaching the third electrode 17. Setting the first distance as three times the second distance at most can make it easier to secure the area for disposing the third electrode 17. From the standpoint of securing the area for disposing the third electrode 17, the third electrode 17 is disposed such that its outer edge is not positioned on the first diagonal line 21 in the region between the second semiconductor layers 12p of the first emission part 12A and the second semiconductor layers 12p of the second emission part 12B.

In this embodiment, as a result of making the first distance larger than the second distance, the region in which the third electrode 17 is disposed is smaller as compared to the light emitting element 10A of the First Embodiment. The area of the third electrode 17 located near the first diagonal line 21 is smaller as compared to the light emitting element 10A of the First Embodiment. As shown in the light emitting device 100C described later, a first reflective member 50 having light reflectivity is disposed on the region in which the third electrode 17 is not disposed. Accordingly, the light from the light emitting element 10A is reflected by the first reflective member 50 towards the light transmitting member 60 in the region in which the third electrode 17 is not disposed.

Variations of Second Embodiment

Figure 3B:
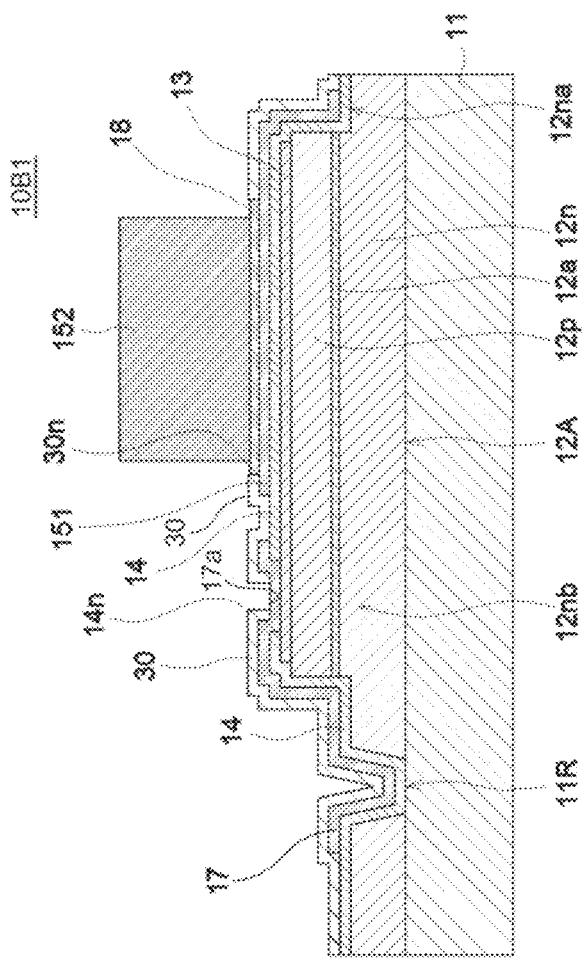
FIG. 3B is a schematic cross-sectional view of a First Variation of the light emitting element according to the Second Embodiment.

The structure of a light emitting element 10B1 that is a First Variation of the Second Embodiment will be explained next with reference to FIG. 3B. FIG. 3B is a schematic cross-sectional view of the light emitting element 10B1 taken along the line corresponding to line IIB-BB in FIG. 1.

The light emitting element 10B1, as shown in FIG. 3B, primarily differs from the light emitting element 10B such that a portion of the third electrode 17 is exposed from the protective film 30. Accordingly, the schematic cross-sectional view of the light emitting element 10B shown in FIG. 3A taken along the line corresponding to line IIB-IIB in FIG. 1 is the same as the cross section shown in FIG. 3B except for the portion of the third electrode 17 that is exposed from the protective film 30. Hereinafter, the same constituents as those in FIG. 1 are denoted with the same reference numerals for which an explanation is omitted.

Figure 3C:
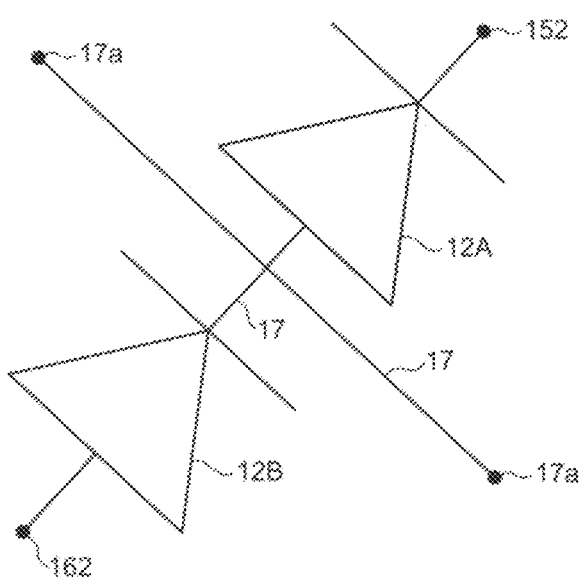
FIG. 3C is a circuit diagram of the light emitting element in FIG. 3B.

As shown in FIG. 3B, the light reflecting electrode 13 is in contact with a portion of the third electrode 17 in the up/down direction. At the location in which the light reflecting electrode 13 and a portion of the third electrode 17 overlap, a portion of the third electrode 17 on the side that opposes the side that is in contact with the light reflecting electrode 13 is exposed from the protective film 30, forming an exposed portion 17a in the third electrode 17. In a plan view, the exposed portion 17a is formed in each of the first openings 14p. Here, FIG. 3C is a circuit diagram of the light emitting element 10B1 that includes the exposed portions 17a. As shown in FIG. 3C, the first external connection part 152, the first emission part 12A, the third electrode 17, the second emission part 12B, and the second external connection part 162 are electrically serially connected. In the first emission part 12A, the first external connection part 152, the seed electrode 18, the first wiring part 151, the first semiconductor layer 12n, the active layer 12a, the second semiconductor layer 12p, the light reflecting electrode 13, and the third electrode 17 are electrically connected. In the second emission part 12B, the third electrode 17, the first semiconductor layer 12n, the active layer 12a, the second semiconductor layer 12p, the light reflecting electrode 13, the second wiring part 161, the seed electrode 18, and the second external connection part 162 are electrically connected. The third electrode 17 is electrically connected between the first emission part 12A and the second emission part 12B, and the exposed portions 17a have the same potential.

In the light emitting element 10B1, the electrical properties of the first emission part 12A and the second emission part 12B can be evaluated, for example, by touching a probe of a tester to the first external connection part 152 and the second external connection part 162. Thus, in the light emitting element 10B1, the electrical properties of the first emission part 12A combined with the second emission part 12B can be evaluated. In addition, in the light emitting element 10B1, the electrical properties of the first emission part 12A can be evaluated by using one of the exposed portions 17a and the first external connection part 152. Furthermore, the electrical properties of the second emission part 12B can be evaluated by using one of the exposed portions 17a and the second external connection part 162. Accordingly, in the light emitting element 10B1, in addition to the electrical properties of the first emission part 12A combined with the second emission part 12B, the electrical properties of the first emission part 12A and the second emission part 12B can be individually evaluated. Providing the ability to individually evaluate the electrical properties of the first emission part 12A and the second emission part 12B can improve the reliability in the evaluation of the light emitting element 10B1.

Figure 3D:
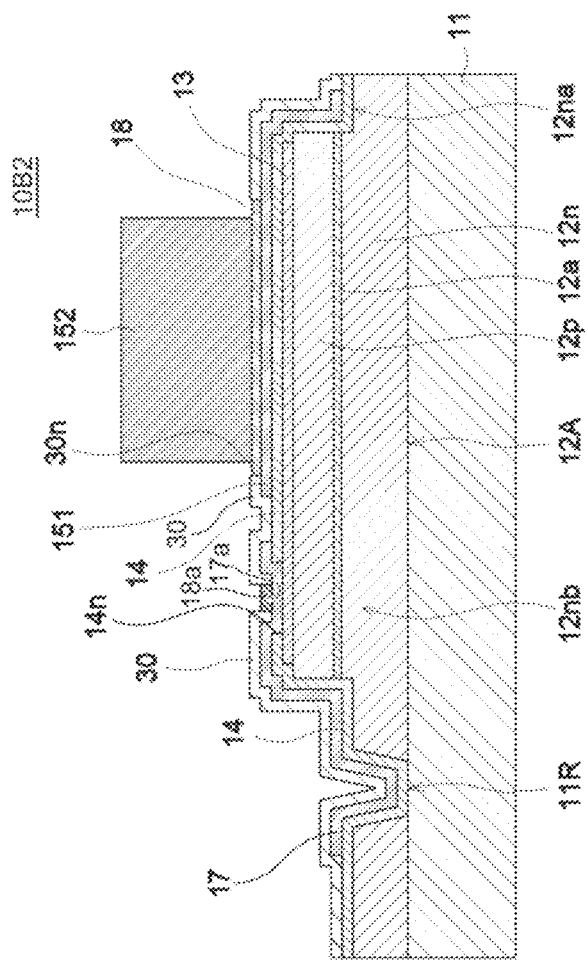
FIG. 3D is a schematic cross-sectional view of a Second Variation of the light emitting element according to the Second Embodiment.

The structure of a light emitting element 10B2 that is a Second Variation of the Second Embodiment will be explained next with reference to FIG. 3D. FIG. 3D is a schematic cross-sectional view of the light emitting element 10B2 taken along the line corresponding to line IIB-BB in FIG. 1.

The light emitting element 10B2, as shown in FIG. 3D, differs from the light emitting element 10B1 that is the First Variation of the Second Embodiment by disposing a metal layer on the exposed portions 17a of the light emitting element 10B1. Hereinafter, the same constituents as those in FIG. 3B are denoted with the same reference numerals for which an explanation is omitted.

As shown in FIG. 3D, a metal layer 18a is disposed on the exposed portion 17a. For the material for the metal layer 18a, for example, the same material as that for the seed electrode 18 is used. In this case, the metal layer 18a may be formed at the same time the seed electrodes 18 are formed. By disposing a metal layer 18a, a probe of a tester can be touched to the metal layer 18a. Touching a probe to an exposed portion 17a of the third electrode 17 via a metal layer 18a can reduce the damage to the third electrode 17.

Third Embodiment

The structure of a light emitting element 10C according to a Third Embodiment will be explained next with reference to FIG. 4.

Figure 4:
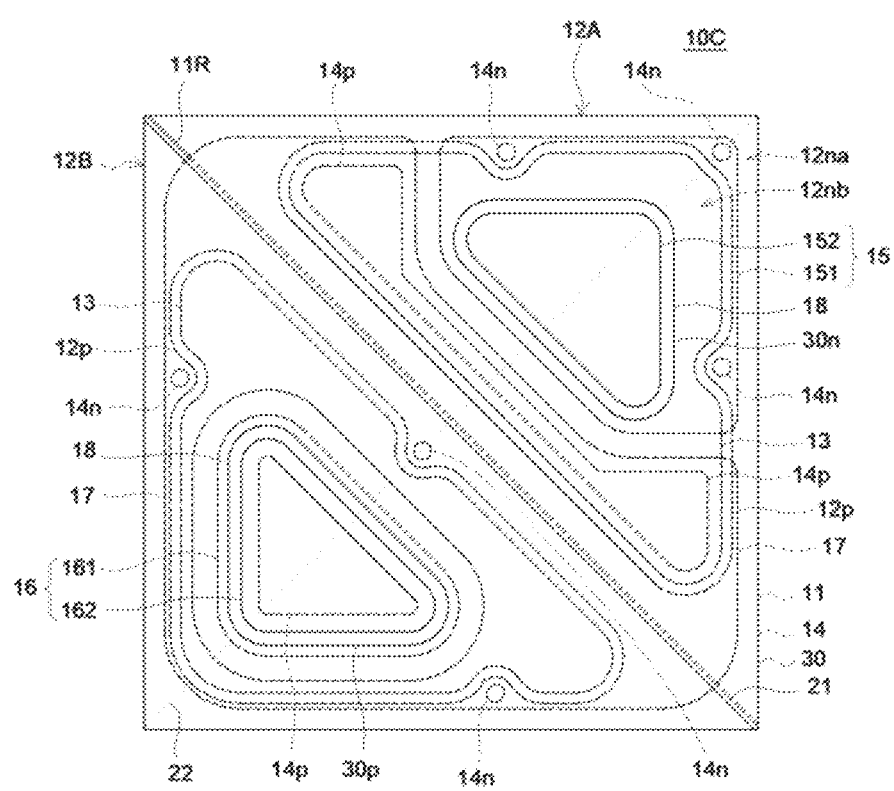
FIG. 4 is a schematic top plan view of a light emitting element according to a Third Embodiment.

The light emitting element 10C, as shown in FIG. 4, primarily differs from the light emitting element 10A in terms of the layout of the second opening 14P provided in the first emission part 12A. Hereinafter, the same constituents as those in FIG. 1 are denoted with the same reference numerals for which an explanation is omitted.

As shown in FIG. 4, in this embodiment, one second opening 14p is continuously formed in the region between the first external connection part 152 and the second external connection part 162 and the region other than the region between the first external connection part 152 and the second external connection region 162. This can make the region in which the third electrode 17 is electrically connected to the second semiconductor layer 12p of the first emission part 12A larger than that in the light emitting element 10A of the First Embodiment. This, as a result, can lower the forward voltage Vf of the light emitting element 10C.

In the direction in parallel with the second diagonal line 22, the width of the second opening 14p located in the region between the first external connection part 152 and the second external connection part 162 is smaller than the width of the second opening 14p located in the other region. This can make it easier to secure a large area in which the third electrode 17 is electrically connected to the second semiconductor layer 12p of the first emission part 12A while reducing the distance between the first external connection part 152 and the second external connection part 162. In this embodiment, the first external connection part 152 can be the first electrode 15, and the second external connection part 162 can be the second electrode 16.

Fourth Embodiment

The structure of a light emitting element 10D according to a Fourth Embodiment will be explained next with reference to FIG. 5. Hereinafter, the same constituents as those in FIG. 1 are denoted with the same reference numerals for which an explanation is omitted.

Figure 5:
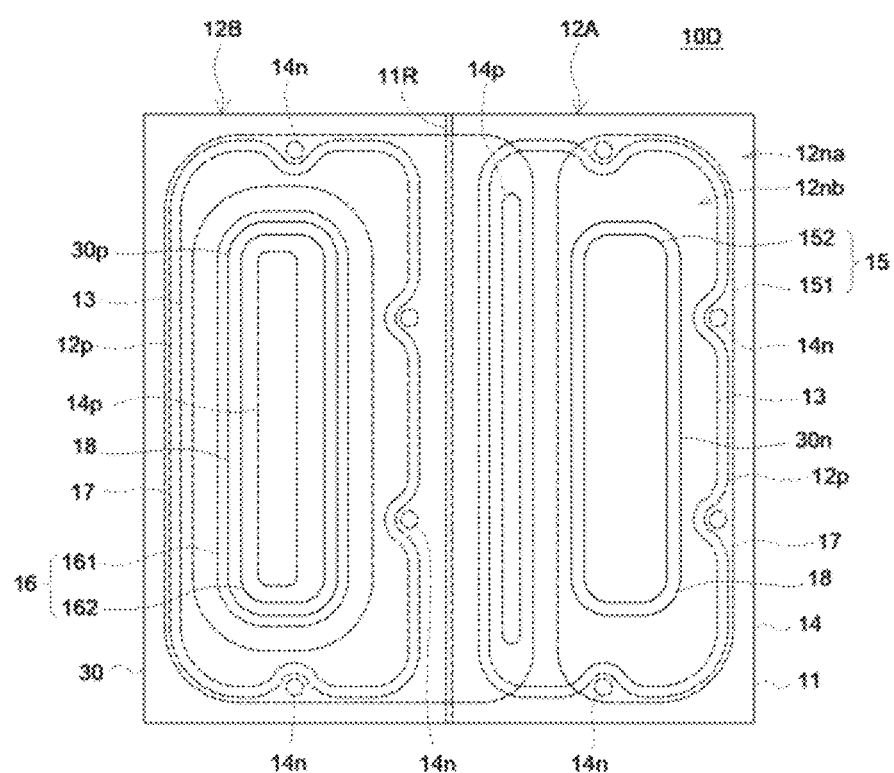
FIG. 5 is a schematic top plan view of a light emitting element according to a Fourth Embodiment.

In the light emitting element 10D, as shown in FIG. 5, the exposed part 11R of the substrate 11 is provided to overlap the straight line passing the center of the substrate 11 and bisecting a side of the substrate 11. The first external connection part 152 and the second external connection part 162 are disposed to oppose one another in the direction orthogonal to the direction that parallels the exposed part 11R. The top plan view shapes of the first emission part 12A and the second emission part 12B are substantially quadrangular. In a top plan view, the area of the first emission part 12A is substantially the same as the area of the second emission part 12B. The top plan view shapes of the first external connection part 152 and the second external connection part 162 are rounded rectangles. The first emission part 12A and the second emission part 12B each have four first openings 14n. Two of the four first openings 14n in the second emission part 12B are located between the first external connection part 152 and the second external connection part 162. In the direction orthogonal to the direction parallel to the exposed part 11R, two of the four first openings 14n in the first emission part 12A are located between the first external connection part 152 and the outer edge of the substrate 11. The second opening 14p in the first emission part 12A is provided along the exposed part 11R. The second opening 14p in the first emission part 12A is continuously formed across the region between the first external connection part 152 and the second external connection part 162 and the region other than the region between the first external connection part 152 and the second external connection part 162. In this embodiment, the first external connection part 152 can be the first electrode 15. The second external connection part 162 can be the second electrode 16.

The light emitting element 10D of this embodiment, similar to the light emitting element 10A of the First Embodiment described above, can improve the light emission distribution of the light emitting element 10D while securing relatively large areas of the active layers 12a of the first emission part 12A and the second emission part 12B.

Light Emitting Device 100A

Figure 6A:
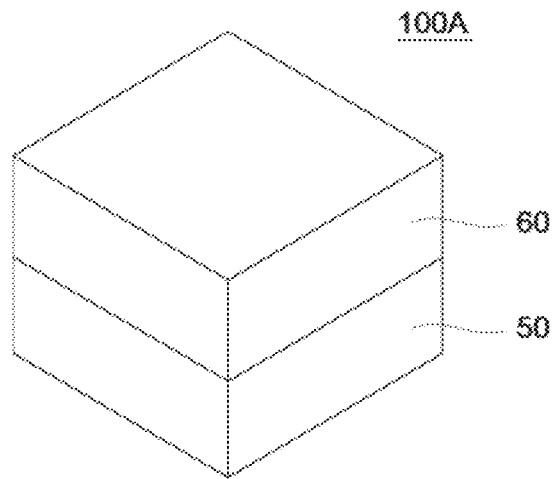
FIG. 6A is a schematic perspective view of a light emitting device employing a light emitting element according to the First Embodiment.
Figure 6B:
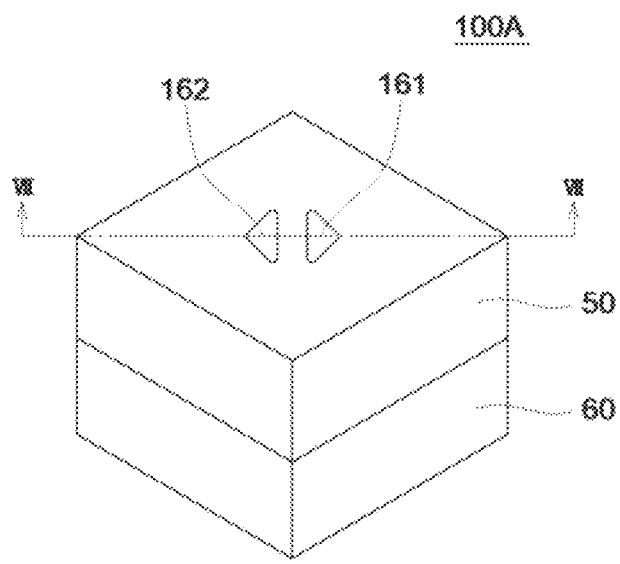
FIG. 6B is a schematic perspective view of the light emitting device employing a light emitting element according to the First Embodiment.

The structure of a light emitting device 100A employing a light emitting element 10A will be explained with reference to FIG. 6A, FIG. 6B, and FIG. 7. FIG. 6A and FIG. 6B are perspective views of the light emitting device 100A. The cross section shown in FIG. 7 is a schematic representation of the cross section taken along line VII-VII in FIG. 6B.

Figure 7:
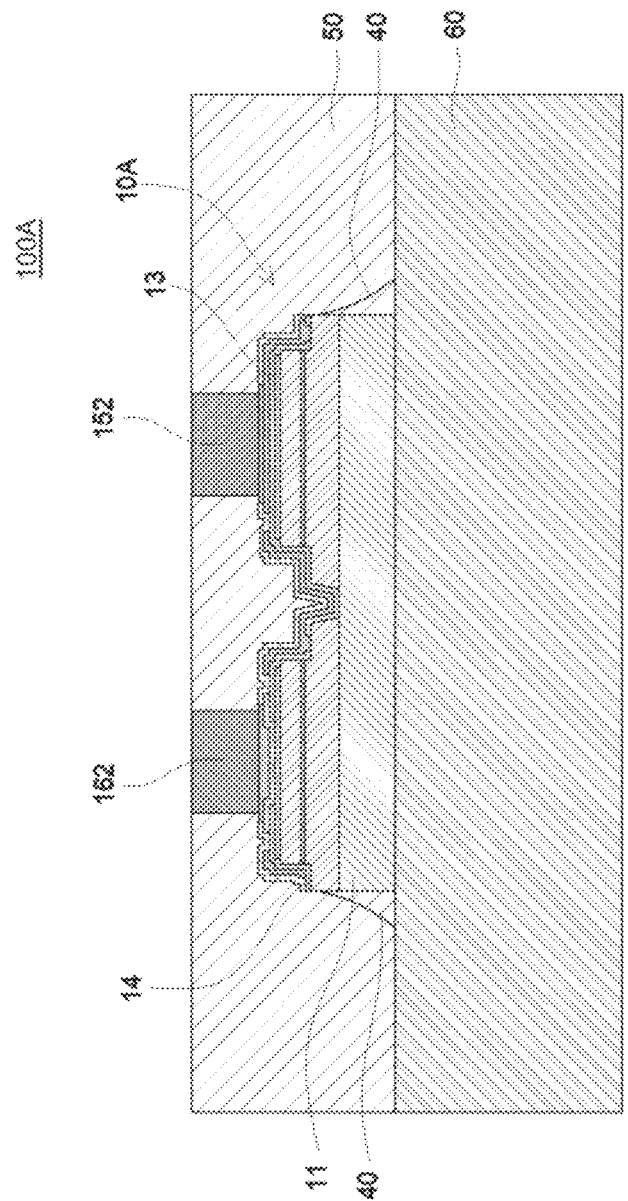
FIG. 7 is a schematic cross-sectional view taken along line VII-VII in FIG. 6B.

The light emitting device 100A has, as shown in FIG. 6A, FIG. 6B, and FIG. 7, a light emitting element 10A, a cover member 40 covering the lateral faces of the light emitting element 10A, a first reflective member 50 covering the lateral faces of the light emitting element 10A and the surface of the cover member 40, and a light transmitting member 60 disposed on the lower face of the substrate 11 of the light emitting element 10A.

The cover member 40, as shown in FIG. 7, covers at least portions of the lateral faces of the light emitting element 10A and the upper face of the light transmitting member 60. The cover member 40 covers a portion of each lateral face of the light emitting element 10A. The substrate 11 of the light emitting element 10A is covered by the cover member 40. The cover member 40 has curved faces where it is in contact with the first reflective member 50. Disposing such a cover member 40 allows the outgoing light from the light emitting element 10A to be reflected by the curved faces of the cover member 40 towards the light transmitting member 60, thereby improving the light extraction efficiency.

The first reflective member 50, as shown in FIG. 7, covers portions of the upper face and portions of the lateral faces of the light emitting element 10A, the curved faces of the cover member 40, and the upper face of the light transmitting member 60. The first reflective member 50 covers the lateral faces of the first external connection part 152 and the second external connection part 162. The first reflective member 50 is disposed so as not to cover a portion of the first external connection part 152 and a portion of the second external connection part 162. The surfaces of the first external connection part 152 and the second external connection part 162 exposed from the first reflective member 50 function as conductive interfaces with an external circuit. The upper face of the first reflective member 50 is substantially coplanar with the upper faces of the first external connection part 152 and the second external connection part 162.

For the first reflective member 50, a resin having light reflectivity or a ceramic is used. For the first reflective member 50, for example, a resin containing a light reflecting substance can be used. For example, a silicone resin, modified silicone resin, epoxy resin or the like is used for the resin. Titanium oxide, silicon oxide, alumina, or the like is used for the light reflecting substance. The first reflective member 50 having light reflectivity can reflect the outgoing light from the light emitting element 10A thereby improving the light extraction efficiency. The first reflective member 50 preferably has a reflectance of at least 60%, for example, more preferably at least 70% with respect to the wavelength of the outgoing light from the light emitting element 10A.

The light transmitting member 60 is disposed on the lower face of the substrate 11 of the light emitting element 10A. The light transmitting member 60 can contain a light reflecting substance and/or a phosphor capable of converting the wavelength of a portion of the outgoing light from the light emitting element 10A. The light transmitting member 60 can be formed by using, for example, a resin, glass, ceramic, or the like. For the light transmitting member 60 containing a phosphor, for example, a sintered body of a phosphor, or a resin, glass, or ceramic containing a phosphor can be used.

For the phosphor contained in the light transmitting member 60, any known material can be used. For the phosphor contained in the light transmitting member 60, for example, yttrium aluminum garnet based phosphors (e.g., $Y_3(Al,Ga)_5O_{12}:Ce$), lutetium aluminum garnet based phosphors (e.g., $Lu_3(Al,Ga)_5O_{12}:Ce$), terbium aluminum garnet based phosphors (e.g., $Tb_3(Al,Ga)_5O_{12}:Ce$), CCA-based phosphors (e.g., $Ca_{10}(PO_4)_6Cl_2:Eu$), SAE-based phosphors (e.g., $Sr_4Al_{14}O_{25}:Eu$), chlorosilicate based phosphors (e.g., $Ca_8MgSi_4O_{16}Cl_2:Eu$), nitride based phosphors, such as β-SiAlON based phosphors (e.g., $(Si,Al)_3(O,N)_4:Eu$), α-SiAlON based phosphors (e.g., $Ca(Si,Al)_{12}(O,N)_{16}:Eu$), SLA based phosphors (e.g., $SrLiAl_3N_4:Eu$), CASN-based phosphors (e.g., $CaAlSiN_3:Eu$), or SCASN-based phosphors (e.g., $(Sr,Ca)AlSiN_3:Eu$), fluoride based phosphors, such as KSF-based phosphors (e.g., $K_2SiF_6:Mn$), KSAF-based phosphors (e.g., $K_2(Si,Al)F_6:Mn$), or MGF-based phosphors (e.g., $3.5MgO \cdot 0.5MgF_2 \cdot GeO_2:Mn$), phosphors having a Perovskite structure (e.g., $CsPb(F,Cl,Br,I)_3$), quantum dot phosphors (e.g., CdSe, InP, $AgInS_2$ or $AgInSe_2$), and the like can be used. These phosphors in combination with the wavelength of the light from the light emitting element can produce a light emitting device having a desired emission color.

The light transmitting member 60, when disposed to cover the lower face of the substrate 11 of the light emitting element 10A, can be bonded to the substrate via an adhesive material. For the adhesive material, for example, a light transmissive resin, such as epoxy or silicone, can be used. The light transmitting member 60 may be bonded to the lower face of the substrate 11 of the light emitting element 10A by a direct bonding method, such as surface activated bonding, atomic diffusion bonding, hydroxyl group bonding, or the like.

Light Emitting Device 100B

Figure 8A:
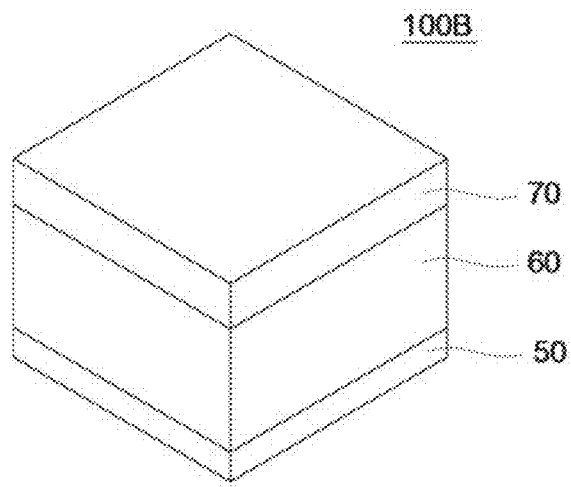
FIG. 8A is a schematic perspective view of a light emitting device employing a light emitting element according to the First Embodiment.
Figure 8B:
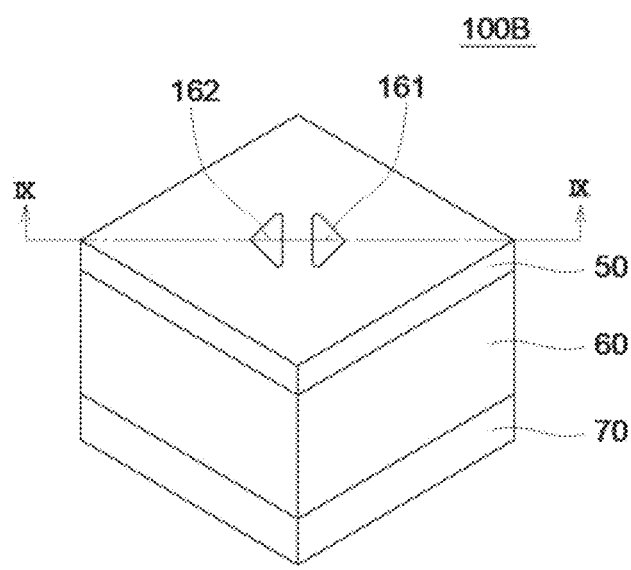
FIG. 8B is a schematic perspective view of the light emitting device employing a light emitting element according to the First Embodiment.

The structure of a light emitting device 100B employing a light emitting element 10A will be explained with reference to FIG. 8A, FIG. 8B, and FIG. 9. FIG. 8A and FIG. 8B are perspective views of the light emitting device 100B. The cross section shown in FIG. 9 is a schematic representation of the cross section taken along line IX-IX in FIG. 8B.

Figure 9:
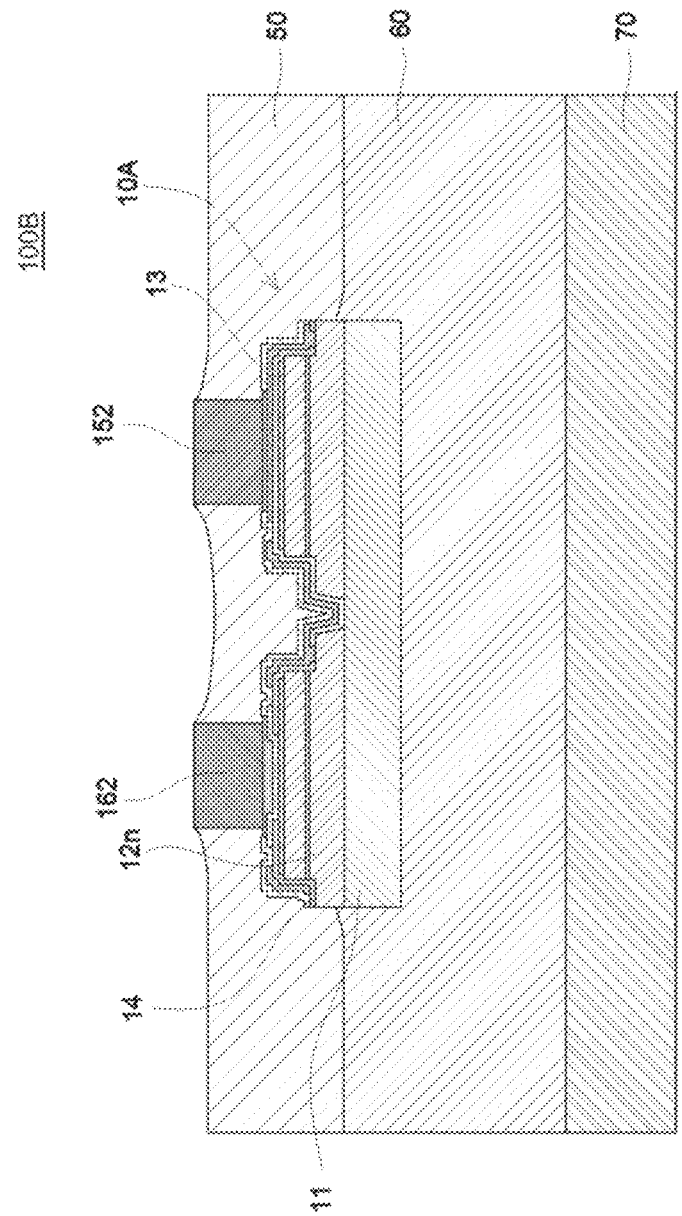
FIG. 9 is a schematic cross-sectional view taken along line IX-IX in FIG. 8B.

The light emitting device 100B, as shown in FIG. 8A, FIG. 8B, and FIG. 9, primarily differs from the light emitting device 100A in terms of the arrangement of the first reflective member 50, the light transmitting member 60, and the second reflective member 70, in addition to not having a cover member 40. Hereinafter, the same constituents as those in the light emitting device 100A shown in FIG. 6A, FIG. 6B, and FIG. 7 are denoted with the same reference numerals for which an explanation is omitted.

The light emitting device 100B has a light emitting element 10A, a first reflective member 50 covering the upper face of the light emitting element 10A in part, a light transmitting member 60 covering the lateral faces and the lower face of the substrate 11 of the light emitting element 10A, and a second reflective member 70 disposed on the lower face of the light transmitting member 60.

The first reflective member 50, as shown in FIG. 9, covers the upper face of the light emitting element 10A in part, and the upper face of the light transmitting member 60. The first reflective member 50 is not disposed on the lateral faces or the lower face of the substrate 11. This allows the portion of the outgoing light from the light emitting element 10A that advances towards the first reflective member 50 to be reflected towards the light transmitting member 60, allowing the outgoing light from the light emitting element 10A to enter the light transmitting member 60 in an efficient manner. The upper face of the first reflective member 50 is positioned lower than the upper faces of the first external connection part 152 and the second external connection part 162. The upper face of the first reflective member 50 located between the first external connection part 152 and the second external connection part 162 is positioned lower than the upper face of the first reflective member 50 located elsewhere.

The light transmitting member 60 is disposed on the lateral faces of the first semiconductor layers 12n, the lateral faces and the lower face of the substrate 11. A portion of the outgoing light from the light emitting element 10A is extracted from the lateral faces of the light transmitting member 60.

The second reflective member 70 is disposed on the lower face of the light transmitting member 60. The light transmitting member 60 is disposed between the first reflective member 50 and the second reflective member 70. For the second reflective member 70, a similar material to that described for the first reflective member 50 can be used. Furthermore, for the second reflective member 70, a metal material having light reflectivity or a DBR (distributed Bragg reflector) that includes multiple dielectric layers can be used.

Light Emitting Device 100C

Figure 10:
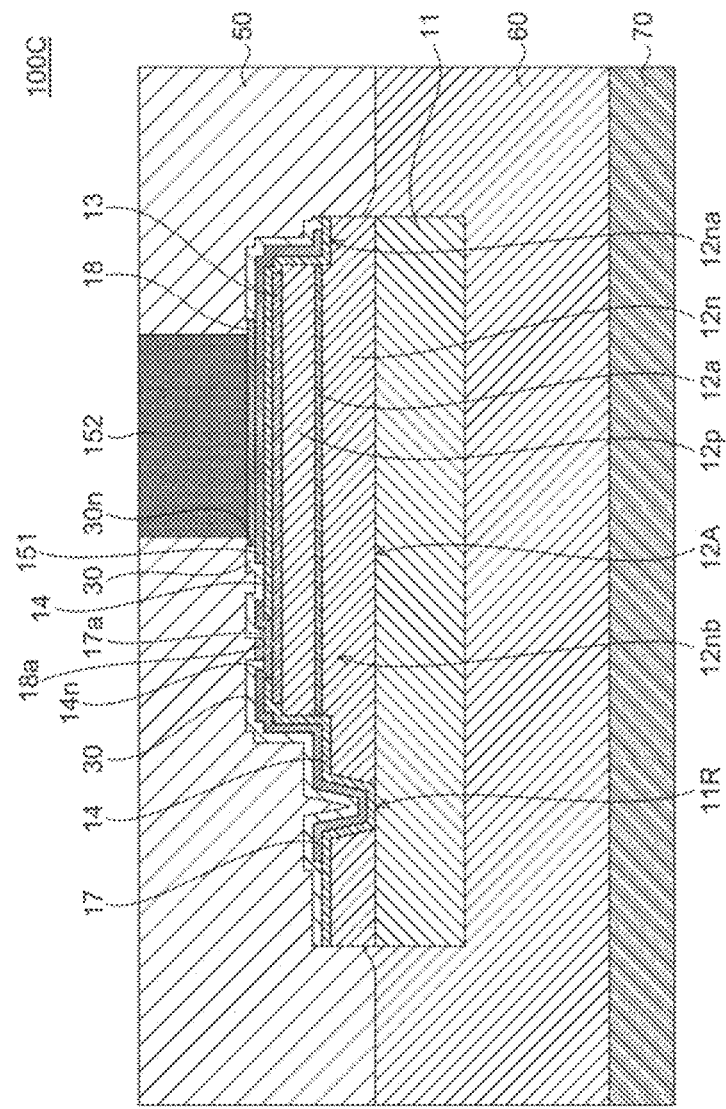
FIG. 10 is a schematic cross-sectional view of a light emitting device employing a light emitting element of the Second Variation of the Second Embodiment.

The structure of a light emitting device 100C employing a light emitting element 10B2 will be explained with reference to FIG. 10. FIG. 10 is a schematic cross-sectional view of the light emitting device 100C that uses a light emitting element 10B2. More specifically, FIG. 10 is a schematic cross-sectional view of the light emitting element 10B2 in the light emitting device 100C taken along the line corresponding to line IIB-IIB in FIG. 1. The light emitting device 100 has similar perspective views to those shown in FIGS. 8A and 8B. In the light emitting device 100C, a light emitting element 10B2 is used, but either a light emitting element 10B or a light emitting element 10B1 can be used instead.

The light emitting device 100C primarily differs from the light emitting device 100B such that the first distance between the outer edge of the third electrode 17 and the outer edge of the substrate 11 on the first diagonal line 21 at each end in the light emitting element 10B2 is larger than the second distance between the outer edge of the third electrode 17 and the outer edge of the substrate 11 on the second diagonal line 22 in the second emission part 12B. Hereinafter, the same constituents as those in the light emitting device 100B shown in FIG. 8A, FIG. 8B, and FIG. 9 are denoted with the same reference numerals for which an explanation is omitted.

As shown in FIG. 10, the light emitting device 100C has a light emitting element 10B2, a first reflective member 50 covering the upper face of the light emitting element 10B2 in part, a light transmitting member 60 covering the lateral faces and the lower face of the substrate 11 of the light emitting element 10B2, and a second reflective member 70 disposed on the lower face of the light transmitting member 60.

In the light emitting element 10B2, the first distance between the outer edge of the third electrode 17 and the outer edge of the substrate 11 on the first diagonal line 21 is shorter as compared to the light emitting device 100B. In other words, the light emitting device 100C that uses a light emitting element 10B2 has a smaller region in which the third electrode 17 is disposed in a top plan view as compared to the light emitting device 100B that uses a light emitting element 10A. The first reflective member 50 having light reflectivity is disposed on the region in which the third electrode 17 is not disposed. Accordingly, in the region in which the third electrode 17 is not disposed, the light from the light emitting element 10B2 is reflected by the first reflective member 50 towards the light transmitting member 60. Thus, as compared to the light emitting device 100B described above, more light from the light emitting element 10B2 that advances towards the first reflective member 50 can be reflected towards the light transmitting member 60 thereby allowing the light from the light emitting element 10B2 to efficiently enter the light transmitting member 60. Accordingly, the light emitting device 100C can further improve the light emission distribution as compared to the light emitting device 100B.

Certain embodiments of light emitting elements and light emitting devices according to the present invention have been specifically explained above. However, the subject matter of the present invention is not limited to the described embodiments, and should be broadly interpreted based on the scope of claims. Needless to say, various changes and modifications made based on the description are encompassed within the subject matter of the present invention.

What is claimed is:

1. A light emitting element comprising:
  a substrate;
  a first emission part and a second emission part disposed on the substrate, the first emission part and the second emission part each comprising a first semiconductor layer of a first conductivity type, a second semiconductor layer of a second conductivity type, and an active layer positioned between the first semiconductor layer and the second semiconductor layer;
  an insulation layer covering the first emission part and the second emission part and including:
    a plurality of first openings that includes multiple first openings located above the first semiconductor layer of the first emission part, and multiple first openings located above the first semiconductor layer of the second emission part, and
a plurality of second openings that include at least one second opening located above the second semiconductor layer of the first emission part, and at least one second opening located above the second semiconductor layer of the second emission part, wherein:
the first openings are positioned outward of a periphery of the second semiconductor layer in a top plan view;
a first electrode disposed on the insulation layer and electrically connected to the first semiconductor layer of the first emission part at the first openings located above the first semiconductor layer of the first emission part;
a second electrode electrically connected to the second semiconductor layer of the second emission part at the at least one second opening located above the second semiconductor layer of the second emission part; and
a third electrode disposed on the insulation layer, electrically connected to the second semiconductor layer of the first emission part at the at least one second opening located above the second semiconductor layer of the first emission part, and electrically connected to the first semiconductor layer of the second emission part at the first openings located above the first semiconductor layer of the second emission part, wherein;
the substrate has an exposed part exposed from the first emission part and the second emission part, the exposed part overlapping a straight line that passes the center of the substrate in a top plan view,
the first electrode includes a first wiring part disposed on the first semiconductor layer, and a first external connection part disposed on the first wiring part and electrically connected to the first wiring part,
the second electrode includes a second wiring part disposed on the second semiconductor layer, and a second external connection part disposed on the second wiring part and electrically connected to the second wiring part, and
the at least one second opening is located above the first semiconductor layer of the first emission part is located in a region other than a region between the first external connection part and the second external connection part.

2. The light emitting element according to claim 1, wherein:
the substrate has a quadrangular shape in a top plan view, and
in a top plan view, the exposed part extends from a first corner of the substrate to a second corner of the substrate located diagonally opposite the first corner, on a first diagonal line.

3. The light emitting element according to claim 2, wherein:
in the top plan view, the first external connection part and the second external connection part are positioned on a second diagonal line that extends from a third corner of the substrate to a fourth corner of the substrate located diagonally opposite the third corner.

4. The light emitting element according to claim 3, wherein a first distance between an outer edge of the third electrode and an outer edge of the substrate on the first diagonal line at each end is larger than a second distance between the outer edge of the third electrode and the outer edge of the substrate on the second diagonal line in a region overlapping the second emission part.

5. The light emitting element according to claim 4, wherein at least one of the first openings located above the first semiconductor layer of the second emission part is positioned between the first external connection part and the second external connection part in a top plan view.

6. The light emitting element according to claim 4, wherein at least one of the first openings located above the first semiconductor layer of the first emission part is positioned on the second diagonal line.

7. The light emitting element according to claim 4, wherein the area of the second opening located above the second semiconductor layer of the first emission part is larger than the area of any of the first openings.

8. The light emitting element according to claim 3, wherein at least one of the first openings located above the first semiconductor layer of the second emission part is positioned between the first external connection part and the second external connection part in a top plan view.

9. The light emitting element according to claim 8, wherein at least one of the first openings located above the first semiconductor layer of the first emission part is positioned on the second diagonal line.

10. The light emitting element according to claim 8, wherein the area of the second opening located above the second semiconductor layer of the first emission part is larger than the area of any of the first openings.

11. The light emitting element according to claim 3, wherein at least one of the first openings located above the first semiconductor layer of the first emission part is positioned on the second diagonal line.

12. The light emitting element according to claim 3, wherein the area of the second opening located above the second semiconductor layer of the first emission part is larger than the area of any of the first openings.

13. The light emitting element according to claim 3, wherein the first external connection part and the second external connection part are disposed so as not to be aligned in a direction parallel to the first diagonal line.

14. The light emitting element according to claim 13, wherein each of the first external connection part and the second external connection part has a substantially triangular shape in a top plan view.

15. The light emitting element according to claim 3, wherein a shortest distance between the first external connection part and the second external connection part is in a range of 30% to 60% of a length of a side of the substrate in a top plan view.

16. The light emitting element according to claim 15, wherein each of the first external connection part and the second external connection part has a substantially triangular shape in a top plan view.

17. The light emitting element according to claim 3, wherein each of the first external connection part and the second external connection part has a substantially triangular shape in a top plan view.

18. The light emitting element according to claim 2, wherein the area of the second opening located above the second semiconductor layer of the first emission part is larger than the area of any of the first openings.

* * * * *